United States Patent
Liu et al.

(10) Patent No.: US 8,742,386 B2
(45) Date of Patent: *Jun. 3, 2014

(54) OXIDE BASED MEMORY WITH A CONTROLLED OXYGEN VACANCY CONDUCTION PATH

(71) Applicant: Micron Technology, Inc., Boise, ID (US)

(72) Inventors: Jun Liu, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/903,307

(22) Filed: May 28, 2013

(65) Prior Publication Data

US 2013/0292628 A1 Nov. 7, 2013

Related U.S. Application Data

(63) Continuation of application No. 13/087,050, filed on Apr. 14, 2011, now Pat. No. 8,450,154.

(51) Int. Cl.
H01L 29/04 (2006.01)

(52) U.S. Cl.
USPC ............. 257/3; 257/4; 257/E21.613; 438/128

(58) Field of Classification Search
USPC .............................. 438/90, 590; 257/E21.613
See application file for complete search history.

(56) References Cited

U.S. PATENT DOCUMENTS

| | | | |
|---|---|---|---|
| 7,560,721 B1 | 7/2009 | Breitwisch et al. | |
| 7,639,523 B2 | 12/2009 | Celinska et al. | |
| 7,795,606 B2 | 9/2010 | Jin et al. | |
| 8,450,154 B2 * | 5/2013 | Liu et al. | 438/128 |
| 2009/0298253 A1 | 12/2009 | Rossel et al. | |
| 2011/0095259 A1 | 4/2011 | Lee | |
| 2012/0195099 A1 * | 8/2012 | Miao et al. | 365/148 |

* cited by examiner

*Primary Examiner* — Cheung Lee
(74) *Attorney, Agent, or Firm* — Brooks, Cameron & Huebsch, PLLC

(57) ABSTRACT

Methods, devices, and systems associated with oxide based memory can include a method of forming an oxide based memory cell. Forming an oxide based memory cell can include forming a first conductive element, forming a substoichiometric oxide over the first conductive element, forming a second conductive element over the substoichiometric oxide, and oxidizing edges of the substoichiometric oxide by subjecting the substoichiometric oxide to an oxidizing environment to define a controlled oxygen vacancy conduction path near a center of the oxide.

20 Claims, 5 Drawing Sheets

OXIDE BASED MEMORY WITH A CONTROLLED OXYGEN VACANCY CONDUCTION PATH

PRIORITY APPLICATION INFORMATION

This application is a Continuation of U.S. application Ser. No. 13/087,050, filed Apr. 14, 2011, to be issued as U.S. Pat. No. 8,450,154 on May 28, 2013, which is incorporated herein by reference.

TECHNICAL FIELD

The present disclosure relates generally to semiconductor memory devices and methods, and more particularly, to oxide based memory with a controlled oxygen vacancy conduction path.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), flash memory, and resistive, e.g., resistance variable, memory, among others. Types of resistive memory include programmable conductor memory, phase change random access memory (PCRAM), and resistive random access memory (RRAM), among others.

Memory devices are utilized as non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, movie players, and other electronic devices.

Memory devices may include a number of memory cells arranged in a matrix, e.g., array. For example, an access device, such as a diode, a field effect transistor (FET), or bipolar junction transistor (BJT), for a memory cell may be coupled to an access line, e.g., word line, forming a "row" of the array. Each memory cell may be coupled to a data line, e.g., bit line, in a "column" of the array. In this manner, the access device of a memory cell may be accessed through a row decoder activating a row of memory cells by selecting the word line coupled to their gates. The programmed state of a selected memory cell may be determined, e.g., sensed, by causing different currents to flow in the memory cell depending on the resistance associated with a programmed state for a particular memory cell.

Memory cells may be programmed, e.g., written, to a desired state. That is, one of a number of programmed states, e.g., resistance levels, can be set for a memory cell. For example, a single level cell (SLC) can represent one of two logic states, e.g., 1 or 0. Resistive memory cells can also be programmed to one of more than two programmed states, such as to represent more than two binary digits, e.g., 1111, 0111, 0011, 1011, 1001, 0001, 0101, 1101, 1100, 0100, 0000, 1000, 1010, 0010, 0110, or 1110. Such cells may be referred to as multi state memory cells, multi-digit cells, or multilevel cells (MLCs).

Oxide based memory devices such as RRAM may store data by varying the resistance level of a resistive memory element. Data may be programmed to a selected RRAM cell by applying sources of energy, such as positive or negative electrical pulses, e.g., positive or negative voltage or current pulses, to a particular resistive memory element for a predetermined duration. RRAM cells may be programmed to a number of resistance levels by application of voltages or currents of various magnitudes, polarities, and durations.

With some oxide based memory devices, e.g., RRAM, an electroforming process may be used to form a high oxygen vacancy concentration filament between electrodes, e.g., a virtual cathode and an active anode, to facilitate subsequent switching by oxygen vacancy under the influence of an externally applied electrical field. However, due to the roughness and large size of the electrodes, the electroformed oxygen vacancy conduction path may initiate at random sites, the path may be distorted by defect sites in the oxide material, and/or multiple filaments may be formed, which may lead to device-to-device variation.

DETAILED DESCRIPTION

Methods, devices, and systems associated with oxide based memory can include a method of forming an oxide based memory cell. Forming an oxide based memory cell can include forming a first conductive element, forming a substoichiometric oxide over the first conductive element, forming a second conductive element over the substoichiometric oxide, and oxidizing edges of the substoichiometric oxide by subjecting the substoichiometric oxide to an oxidizing environment to define a controlled oxygen vacancy conduction path near a center of the oxide.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 202 may reference element "02" in FIG. 2C, and a similar element may be referenced as 402 in FIG. 4C. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present invention and are not to be used in a limiting sense.

Figure 1:
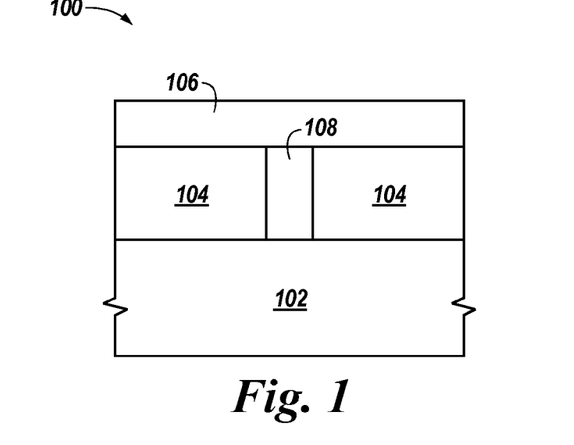
FIG. 1 illustrates a cross-sectional view of a portion of an oxide based memory cell in accordance with one or more embodiments of the present disclosure.

FIG. 1 illustrates a cross-sectional view of a portion of an oxide based memory cell 100 in accordance with one or more embodiments of the present disclosure. The oxide based memory cell can include a first conductive element 102, e.g., a bottom electrode and/or cathode. An oxide 104, e.g., a valence change oxide, can be formed over the first conductive element 102. According to one or more embodiments of the present disclosure, the valence change oxide 104 can include a controlled oxygen vacancy conduction path 108 defined near a center of the valence change oxide 104. A second conductive element 106 can be formed over the valence change oxide 104 and over the controlled oxygen vacancy conduction path 108.

Controlled oxygen vacancy conduction path 108 definition can provide for a conduction path in an oxide based memory cell 100 without electroforming. Electroforming can include applying a high voltage, e.g., larger than would be used to cause switching, across a memory cell to generate a filamentary conduction path between electrodes. Subsequent switching of the memory cell, e.g., between resistance states, is facilitated by the conduction path. However, as described herein, the electroformed oxygen vacancy conduction path may initiate at random sites, the path may be distorted by defect sites in the oxide material, and/or multiple filaments may be formed, which may lead to device-to-device variation. Thus, according to the present disclosure, an oxide based memory cell 100 can be provided with a predefined controlled oxygen vacancy conduction path 108 to avoid the disadvantages associated with the electroforming process. Furthermore, the high voltages associated with the electroforming process can lead to an irreversible state, e.g., conduction path, between the electrodes, or damage to the oxide. Thus, for example, one or more embodiments of the present disclosure can promote more consistent and controllable switching. For example, as used herein a "controlled" oxygen vacancy conduction path can include a conduction path that is defined by the formation of the memory cell 100 such that a location of the conduction path is predetermined and/or singular.

According to one or more embodiments of the present disclosure, the controlled oxygen vacancy conduction path 108 can be predefined by the memory cell 100 material, geometry, and/or process conditions, as described herein. Due to the predefined oxygen vacancy distribution provided by the present disclosure, it is likely that only one conduction path will participate in memory cell 100 switching to improve switching uniformity.

Figure 2A:
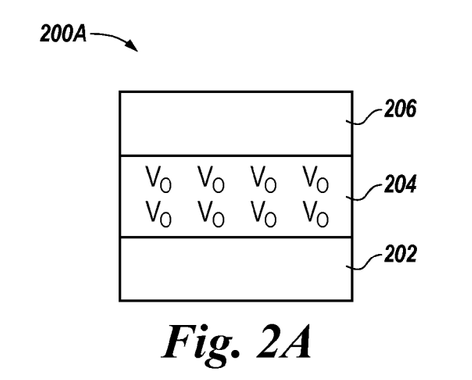
FIGS. 2A-2C illustrate cross-sectional views of process stages associated with forming a portion of an oxide based memory cell in accordance with one or more embodiments of the present disclosure.
Figure 2B:
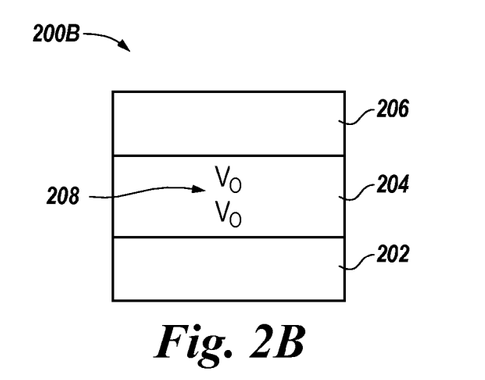
Figure 2C:
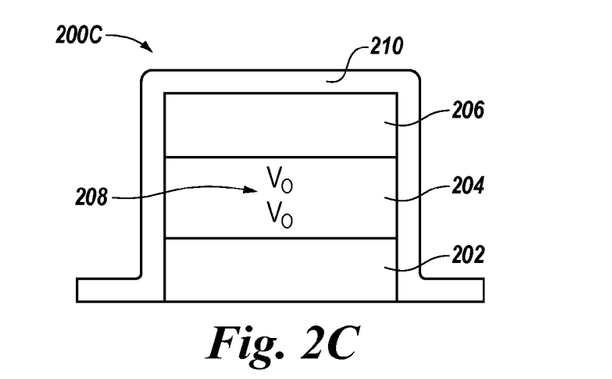

FIGS. 2A-2C illustrate cross-sectional views of process stages associated with forming a portion of an oxide based memory cell in accordance with one or more embodiments of the present disclosure. FIG. 2A illustrates a portion of an oxide based memory cell 200A at a particular process stage. A first conductive element 202, e.g., a cathode, can be formed over a substrate, for example. An oxide 204, e.g., a substoichiometric oxide, can be formed over the first conductive element 202. A substoichiometric oxide can be an oxide that has an oxygen percentage below a stoichiometric ratio for the oxide. A near-stoichiometric oxide can be an oxide that has an oxygen percentage at or approximately at a stoichiometric ratio for the oxide. Examples of oxides 204 include titanium oxide (TiOx), copper oxide (CuOx), and tantalum oxide (TaOx), among others. As illustrated in FIG. 2A, the oxide 204 includes many oxygen vacancies ("Vo"). A second conductive element 206, e.g., an anode, can be formed over the oxide 204. The first conductive element 202 and the second conductive element 206 can be electrodes between which a conductive pathway can be formed through the oxide 204.

FIG. 2B illustrates a portion of an oxide based memory cell 200B, e.g., analogous to the oxide based memory cell 200A illustrated in FIG. 2A, at a subsequent process stage. For example, the edges of the substoichiometric oxide 204 of the memory cell 200A can be oxidized by subjecting the memory cell 200A to an oxidizing environment to define a controlled oxygen vacancy conduction path 208 near a center of the oxide 204, as illustrated for the memory cell 200B in FIG. 2B. The oxidizing environment can oxidize, e.g., fill oxygen vacancies, at the edges of the substoichiometric oxide 204, leaving oxygen vacancies near a center of the oxide 204, which can serve as a controlled oxygen vacancy conduction path 208. The oxidizing environment can include one or more of oxygen and ozone, for instance. Oxidizing the edges of the substoichiometric oxide 204 can include exposing, e.g., thermally annealing, the substoichiometric oxide 204 to, e.g., in, the oxidizing environment. Some embodiments can include the use of oxygen plasma, e.g., plasma ion implantation, for oxidizing the edges of the substoichiometric oxide 204. One or more embodiments can include a wet oxidation process for oxidizing the edges of the substoichiometric oxide 204. In some embodiments, an oxygen vacancy gradient, e.g., a gradient such that greater oxygen vacancies exist near a center of the oxide 204 and fewer oxygen vacancies exist near the edges of the oxide 204, can be created across the substoichiometric oxide 204.

FIG. 2C illustrates a portion of an oxide based memory cell 200C, e.g., analogous to the oxide based memory cell 200A illustrated in FIG. 2A, at a subsequent process stage. The processing stage illustrated in FIG. 2C can be subsequent to the stage illustrated in FIG. 2A, e.g., without going through the stage illustrated in FIG. 2B, or subsequent to the stage illustrated in FIG. 2B, e.g., after subjecting the substoichiometric oxide 204 to an oxidizing environment. The portion of the memory cell 200C, e.g., the first conductive element 202, the oxide 204, and the second conductive element 206, has been encapsulated with an oxygen-rich oxide 210. Oxygen in the oxygen-rich oxide 210 can diffuse into the substoichiometric oxide 204 to define, or further define, the controlled oxygen vacancy conduction path 208 near a center of the oxide 204. For example, oxygen can diffuse into the substoichiometric oxide 204 from the edges to fill the vacancies ("Vo") near the edges, leaving oxygen vacancies near a center of the oxide 204, which can serve as the controlled oxygen vacancy conduction path 208.

Figure 3A:
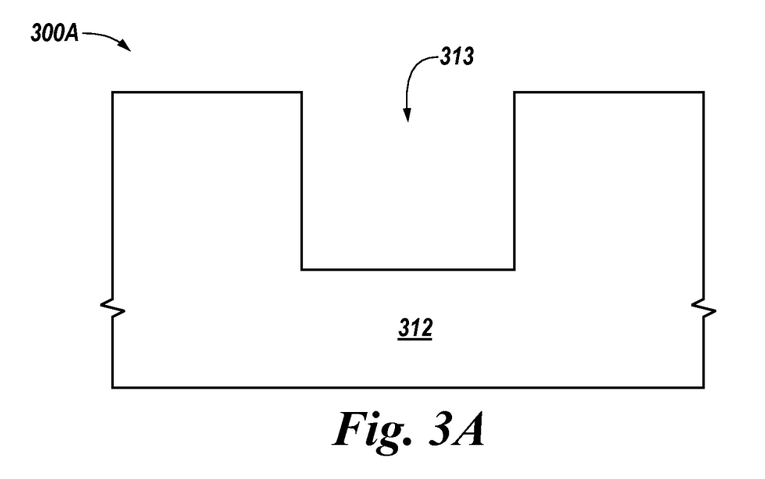
FIGS. 3A-3D illustrate cross-sectional views of process stages associated with forming a portion of an oxide based memory cell in accordance with one or more embodiments of the present disclosure.

FIGS. 3A-3D illustrate cross-sectional views of process stages associated with forming a portion of an oxide based memory cell in accordance with one or more embodiments of the present disclosure. FIG. 3A illustrates a portion of an oxide based memory cell 300A at a particular process stage. A via 313 can be formed in a dielectric 312. The via can be formed by a process such as etching, among others.

Figure 3B:
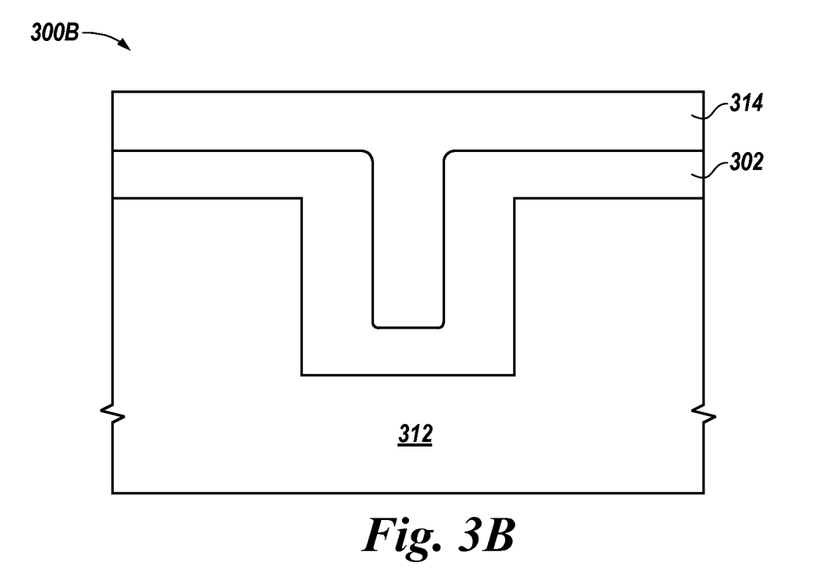

FIG. 3B illustrates a portion of an oxide based memory cell 300B, e.g., analogous to the oxide based memory cell 300A illustrated in FIG. 3A, at a subsequent process stage. A first conductive element 302 can be formed in the via 313. In some embodiments, the first conductive element 302 can be conformally deposited in the via 313 and on the dielectric 312. An oxygen getter material 314 can be formed over the first conductive element 302. An oxygen getter material can be a material that readily absorbs oxygen, e.g., oxygen from another material. In one or more embodiments the oxygen getter material 314 can be formed by deposition, e.g., conformal deposition on the first conductive element 302, including portions of the first conductive element 302 in the via 313. The oxygen getter material 314 can be a conductive oxygen getter material such as titanium or tantalum, among others. In general, an oxygen getter is a material with an affinity for attracting oxygen ions. Thus, as illustrated in FIG. 3B, the via 313 illustrated in FIG. 3A can be filled with a first conductive element 302 and an oxygen getter material 314.

Figure 3C:
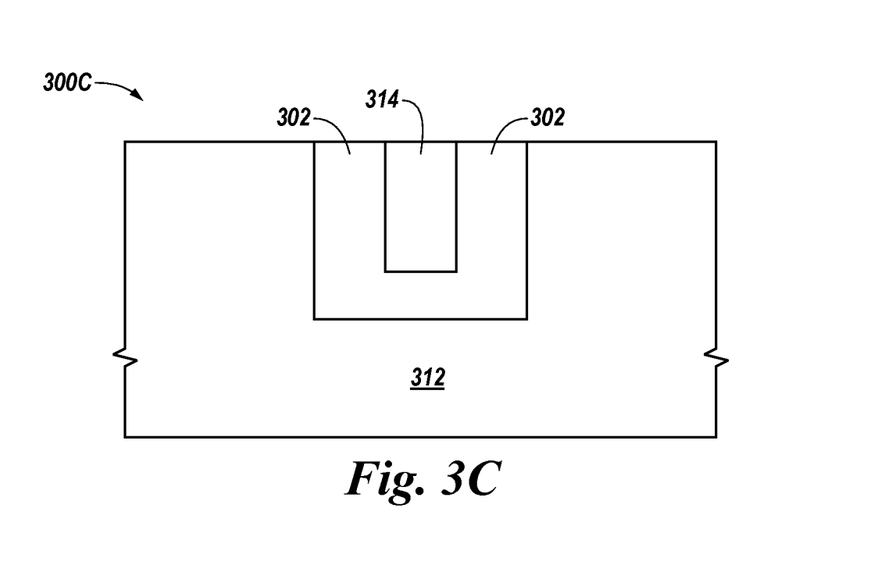
Figure 3D:
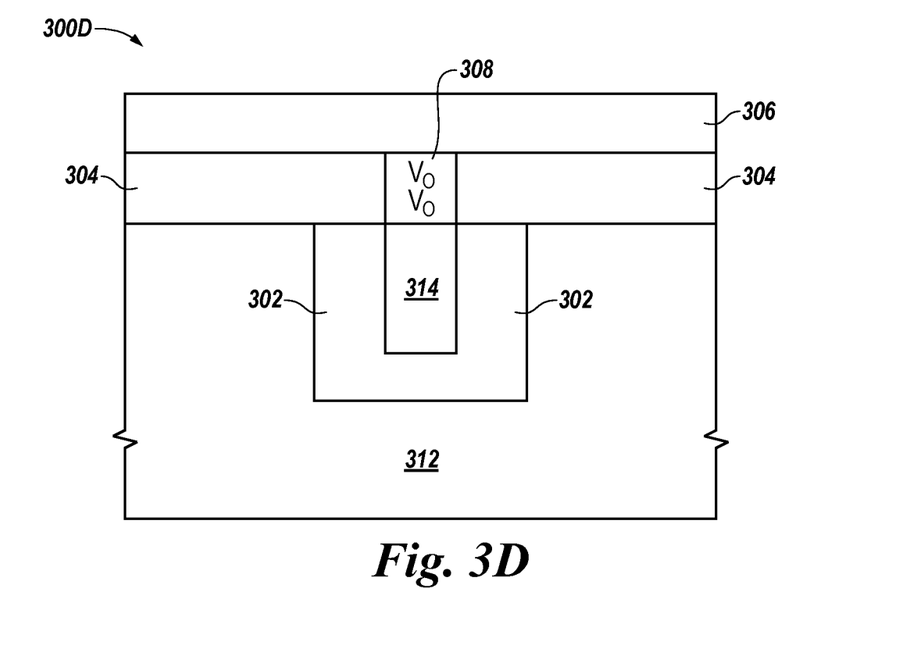

FIG. 3C illustrates a portion of an oxide based memory cell 300C, e.g., analogous to the oxide based memory cell 300A illustrated in FIG. 3A, at a subsequent process stage. Portions of the first conductive element 302 and the oxygen getter material 314 external to the via 313 can be removed, e.g., prior to forming an oxide as illustrated in FIG. 3D. For example, chemical-mechanical polishing (CMP) can be used to planarize the portion of the memory cell 300C. In some embodiments, the removal process can include removing portions of the dielectric 312. In one or more embodiments, the oxygen getter material 314 can form a self-aligned, e.g., formed without the use of patterning, sub-lithography feature of the portion of the memory cell 300C.

FIG. 3D illustrates a portion of an oxide based memory cell 300D, e.g., analogous to the oxide based memory cell 300A illustrated in FIG. 3A, at a subsequent process stage. An oxide 304 can be formed on the first conductive element 302 and on the oxygen getter material 314. Forming the oxide 304 can include defining a controlled oxygen vacancy conduction path 308 in the oxide 304, e.g., over the oxygen getter material 314. A second conductive element 306 can be formed on the oxide 304. The controlled oxygen vacancy conduction path 308 can be defined between the first conductive material 302 and the second conductive material 306.

In one or more embodiments, the first conductive element 302 can be an inert conductive element and the oxide 304 can be a near-stoichiometric oxide. In such embodiments, the oxygen getter material 314 can extract oxygen from the overlying oxide 304 to form a controlled oxygen vacancy conduction path 308 therein. In some embodiments the first conductive element 302 can be an oxygen-rich conductive element, e.g., a ruthenium oxide (RuOx), and the oxide 304 can be a substoichiometric oxide. In such embodiments, the oxygen-rich first conductive element 302 can provide oxygen to remove vacancies in the overlying substoichiometric oxide 304 leaving a controlled oxygen vacancy conduction path 308 near a center of the oxide 304.

Figure 4A:
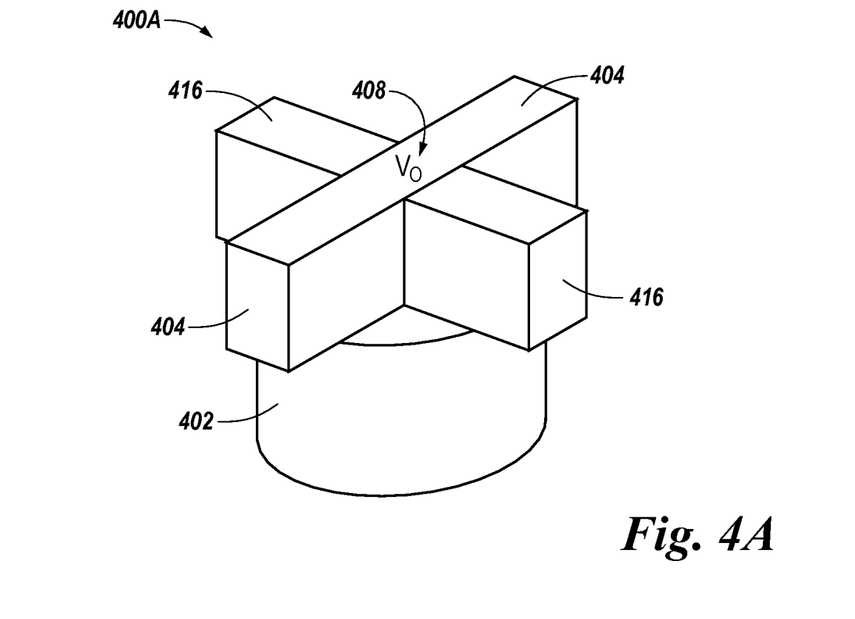
FIG. 4A illustrates a perspective view of a portion of an oxide based memory cell in accordance with one or more embodiments of the present disclosure.

FIG. 4A illustrates a perspective view of a portion of an oxide based memory cell 400A in accordance with one or more embodiments of the present disclosure. A first conductive element 402 can be formed. In some embodiments, the first conductive element 402 can be formed as a pillar. A substoichiometric oxide 404 can be patterned, e.g., in a strip of material, on the first conductive element 402. A first material 416 can be patterned, e.g., in a strip of material, on the first conductive element 402 perpendicular to and intersecting the substoichiometric oxide 404. Gaps between the substoichiometric oxide 404 and the first material 416, e.g., over the first conductive element 402, can be filled with a second material (not specifically illustrated in FIG. 4A, but shown at 410 in FIG. 4D) to define a controlled oxygen vacancy conduction path 408 in the oxide 404. A second conductive element (not specifically illustrated in FIG. 4A, but shown at 406 in FIGS. 4C and 4D) can be formed on the intersection of the substoichiometric oxide 404 and the first material 416. In some embodiments, the second conductive element can also be formed on other portions of the portion of the memory cell 400A, e.g., other portions of the substoichiometric oxide 404 and/or the first material 416. Examples of materials for the substoichiometric oxide 404 include a titanium oxide (TiOx), a copper oxide (CuOx), and a tantalum oxide (TaOx), among others.

In one or more embodiments, the first material 416 can be an oxygen block material and the second material can be an oxygen rich oxide. An oxygen block material can be a material that prevents oxygen from diffusing into another material and/or a material that readily absorbs oxygen. An oxygen rich oxide can be an oxide that can readily provide oxygen, e.g., to another material. In such embodiments, the oxygen rich oxide can provide oxygen to diffuse into the substoichiometric oxide 404, except in the portion of the substoichiometric oxide 404 blocked by the oxygen block material 416 thereby defining a controlled oxygen vacancy conduction path 408 near a center of the oxide 404, e.g., at intersections of the substoichiometric oxide 404 and the oxygen block material 416. In some embodiments, the first material 416 can be an oxygen getter material, the oxide 404 can be stoichiometric, and the second material can be a dielectric that is inert and therefore does not provide oxygen to oxidize the stoichiometric oxide 404. In such embodiments, the oxygen getter material helps to extract oxygen at the intersection of the first material 416 with the stoichiometric oxide 404 to define a controlled oxygen vacancy conduction path 408 near a center of the oxide 404, e.g., at intersections of the stoichiometric oxide 404 and the oxygen getter material 416.

Figure 4B:
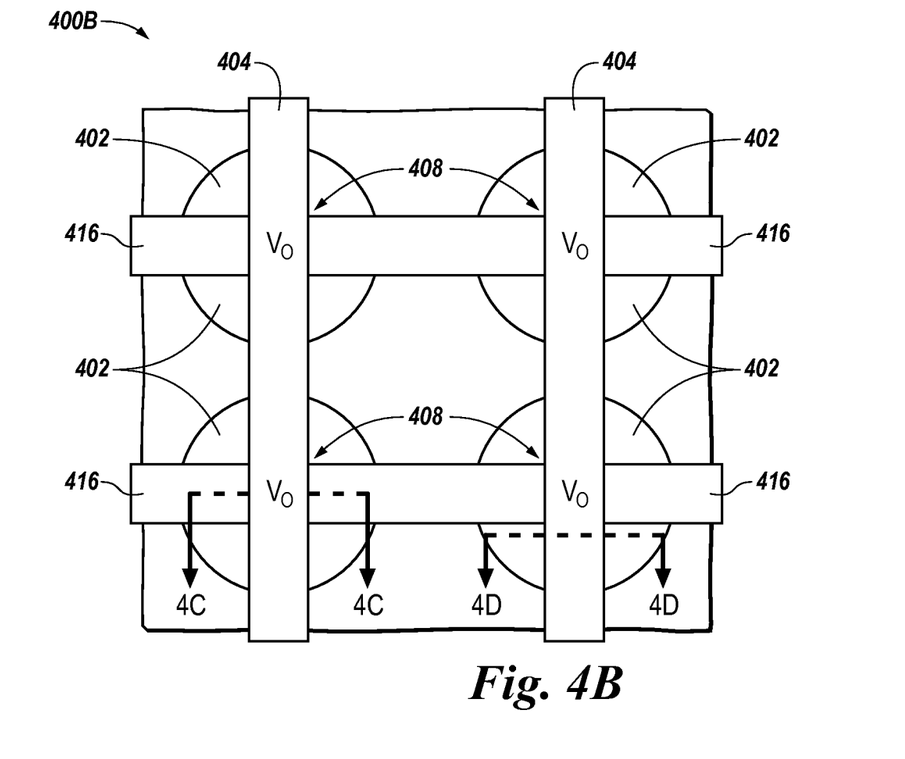
FIG. 4B illustrates a top-down view of a portion of an array of portions of oxide based memory cells.

FIG. 4B illustrates a top-down view of a portion of an array 401 of portions of oxide based memory cells 400B. Each of the portions of oxide based memory cells 400B can be analogous to the portion of the oxide based memory cell 400A illustrated in FIG. 4A. The portion of the array 401 illustrates how a number of portions of memory cells 400B can be arranged in an array where the substoichiometric oxide 404 extend across portions of multiple memory cells 400B as do the first material 416. The size of the array is not limited to the depiction illustrated in FIG. 4B as the array can include more or fewer memory cells 400B.

At least a portion of an array 401 of first conductive elements 402 can be formed. A substoichiometric oxide 404 can be formed on the portion of the array 401 of first conductive elements 402. A first material 416 can be patterned on the portion of the array of first conductive elements 402 perpendicular to and intersecting the substoichiometric oxide 404. As illustrated in FIG. 4B, the substoichiometric oxide 404 can be continuous, while the first material 416 can be discontinuous at the intersections with the first conductive element 404. A gap between the substoichiometric oxide 404 and the first material 416 can be filled with a second material to define a controlled oxygen vacancy conduction path 408 in the oxide 404 as described herein. For example, the controlled oxygen vacancy conduction path 408 can be defined at intersections of the substoichiometric oxide 404 and the first material 416 near a center of the first conductive element 402 for each memory cell 400B. At least a portion of an array of second conductive elements can be formed at least on the intersections of the substoichiometric oxide 404 and the first material 416.

Figure 4C:
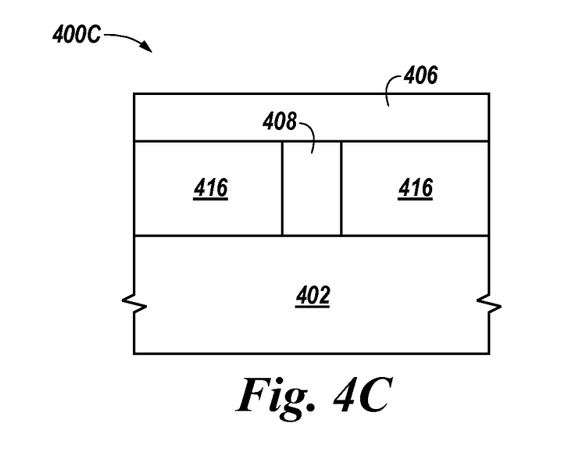
FIG. 4C illustrates a cross-sectional view of a portion of an oxide based memory cell illustrated in FIG. 4B taken along cut line 4C-4C.

FIG. 4C illustrates a cross-sectional view of a portion of an oxide based memory cell 400B illustrated in FIG. 413 taken along cut line 4C-4C. The portion of the memory cell 400C includes the first conductive element 402 underlying the discontinuous first material 416, separated by the controlled oxygen vacancy conduction path 408 near the center of the substoichiometric oxide 404. FIG. 4C also illustrates the second conductive element 406 formed over the controlled oxygen vacancy conduction path 408 in the oxide 404 and over the first material 416.

Figure 4D:
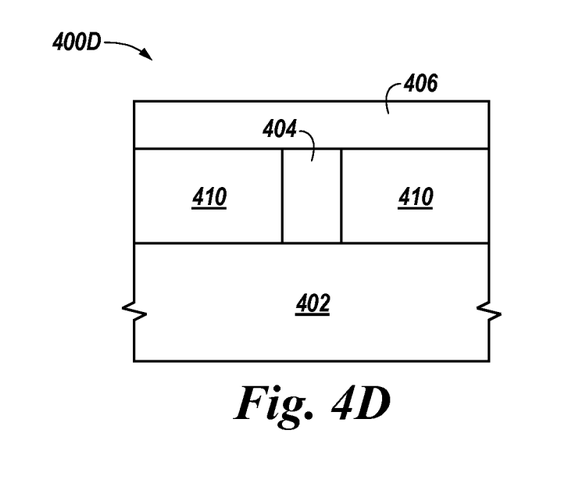
FIG. 4D illustrates a cross-sectional view of a portion of an oxide based memory cell illustrated in FIG. 4B taken along cut line 4D-4D.

FIG. 4D illustrates a cross-sectional view of a portion of an oxide based memory cell 400B illustrated in FIG. 4B taken along cut line 4D-4D. The portion of the memory cell 400D includes the first conductive element 402 underlying a portion of the substoichiometric oxide 404 and underlying portions of the second material 410, which can fill the gaps between the substoichiometric oxide 404 and the first material 416 as described herein. FIG. 4D also illustrates the second conductive element 406 formed over the portion of the substoichiometric oxide 404 and the portions of the second material 410.

Methods, devices, and systems associated with oxide based memory can include a method of forming an oxide based memory cell. Forming an oxide based memory cell can include forming a first conductive element, forming a substoichiometric oxide over the first conductive element, forming a second conductive element over the substoichiometric oxide, and oxidizing edges of the substoichiometric oxide by subjecting the substoichiometric oxide to an oxidizing environment to define a controlled oxygen vacancy conduction path near a center of the oxide.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of Equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An oxide based memory cell, comprising:
   a first conductive element;
   a substoichiometric oxide on the first conductive element; and
   a second conductive element directly on the substoichiometric oxide;
   wherein the memory cell includes a controlled oxygen vacancy conduction path near a center of the substoichiometric oxide.

2. The memory cell of claim 1, wherein the substoichiometric oxide is directly on the first conductive element.

3. The memory cell of claim 1, wherein the controlled oxygen vacancy conduction path is directly between the first conductive element and the second conductive element.

4. The memory cell of claim 1, wherein the first conductive element comprises a pillar and the controlled oxygen vacancy conduction path is at a center of the pillar.

5. The memory cell of claim 1, wherein the controlled oxygen vacancy conduction path is at an intersection of the substoichiometric oxide and a material intersecting the substoichiometric oxide.

6. The memory cell of claim 1, wherein the substoichiometric oxide comprises one of a titanium oxide (TiOx), a copper oxide (CuOx), and a tantalum oxide (TaOx).

7. An oxide based memory cell, comprising:
   a first conductive element;
   a substoichiometric oxide having an oxygen percentage below a stoichiometric ratio for the oxide on the first conductive element; and
   a second conductive element on the substoichiometric oxide;
   wherein the memory cell includes a controlled oxygen vacancy conduction path near a center of the substoichiometric oxide.

8. The memory cell of claim 7, wherein the substoichiometric oxide is directly on the first conductive element.

9. The memory cell of claim 7, wherein the second conductive element is directly on the substoichiometric oxide.

10. The memory cell of claim 7, wherein the controlled oxygen vacancy conduction path is not near the edges of the substoichiometric oxide.

11. The memory cell of claim 7, wherein the controlled oxygen vacancy conduction path is at the center of the substoichiometric oxide.

12. The memory cell of claim 7, wherein the controlled oxygen vacancy conduction path is at an intersection of the substoichiometric oxide and a material intersecting the substoichiometric oxide.

13. The memory cell of claim 12, wherein the material is directly on the first conductive element.

14. An oxide based memory cell, comprising:
    a first conductive element;
    a substoichiometric oxide on the first conductive element; and
    a second conductive element on the substoichiometric oxide;
    wherein the memory cell includes a controlled oxygen vacancy conduction path near a center of the substoichiometric oxide, but not near edges of the substoichiometric oxide.

15. The memory cell of claim 14, wherein the controlled oxygen vacancy conduction path is between the first conductive element and the second conductive element.

16. The memory cell of claim 15, wherein the controlled oxygen vacancy conduction path is near a center of the first conductive element.

17. The memory cell of claim 15, wherein the controlled oxygen vacancy conduction path is near a center of the second conductive element.

18. The memory cell of claim 14, wherein the controlled oxygen vacancy conduction path is at the center of the substoichiometric oxide.

19. The memory cell of claim 14, wherein the controlled oxygen vacancy conduction path is at an intersection of the substoichiometric oxide and a material intersecting the substoichiometric oxide.

20. The memory cell of claim 19, wherein the material is perpendicular to the substoichiometric oxide.

\* \* \* \* \*